United States Patent

Dittmar et al.

Patent Number: 5,342,571
Date of Patent: Aug. 30, 1994

[54] METHOD FOR PRODUCING SPUTTERING TARGET FOR DEPOSITION OF TITANIUM, ALUMINUM AND NITROGEN COATINGS, SPUTTERING TARGET MADE THEREBY, AND METHOD OF SPUTTERING WITH SAID TARGETS

[75] Inventors: Mark B. Dittmar, Grove City; Paul E. Scheiderer, Johnstown, both of Ohio

[73] Assignee: Tosoh SMD, Inc., Grove City, Ohio

[21] Appl. No.: 838,575

[22] Filed: Feb. 19, 1992

[51] Int. Cl.$^5$ .................... B22F 3/02; B22F 3/10; B22F 3/12
[52] U.S. Cl. .................... 419/13; 419/28; 419/38; 419/39; 419/66; 75/244; 75/245; 75/249
[58] Field of Search .................... 419/13, 66, 38, 39, 419/28; 75/244, 245, 249

[56] References Cited

U.S. PATENT DOCUMENTS

| | | | |
|---|---|---|---|
| 4,636,252 | 1/1987 | Yoshimura et al. | 75/238 |
| 4,909,841 | 3/1990 | Iyer et al. | 75/233 |
| 4,943,319 | 7/1990 | Yanagawa et al. | 75/229 |
| 4,954,170 | 9/1990 | Fey et al. | 75/229 |
| 4,961,778 | 10/1990 | Pyzik et al. | 75/230 |

Primary Examiner—Donald P. Walsh
Assistant Examiner—Daniel Jenkins
Attorney, Agent, or Firm—Biebel & French

[57] ABSTRACT

Dual phase sputter targets consisting essentially of TiN and Al, methods of manufacture thereof, and cathodic sputtering methods using such targets are disclosed. The targets are prepared by blending TiN and Al powders followed by compaction to full density. The thus compacted materials are optionally sintered and are then formed into the desired target shape. The targets are used in cathodic sputtering processes to form opaque, dark colored decorative and wear resistant coatings.

20 Claims, 1 Drawing Sheet

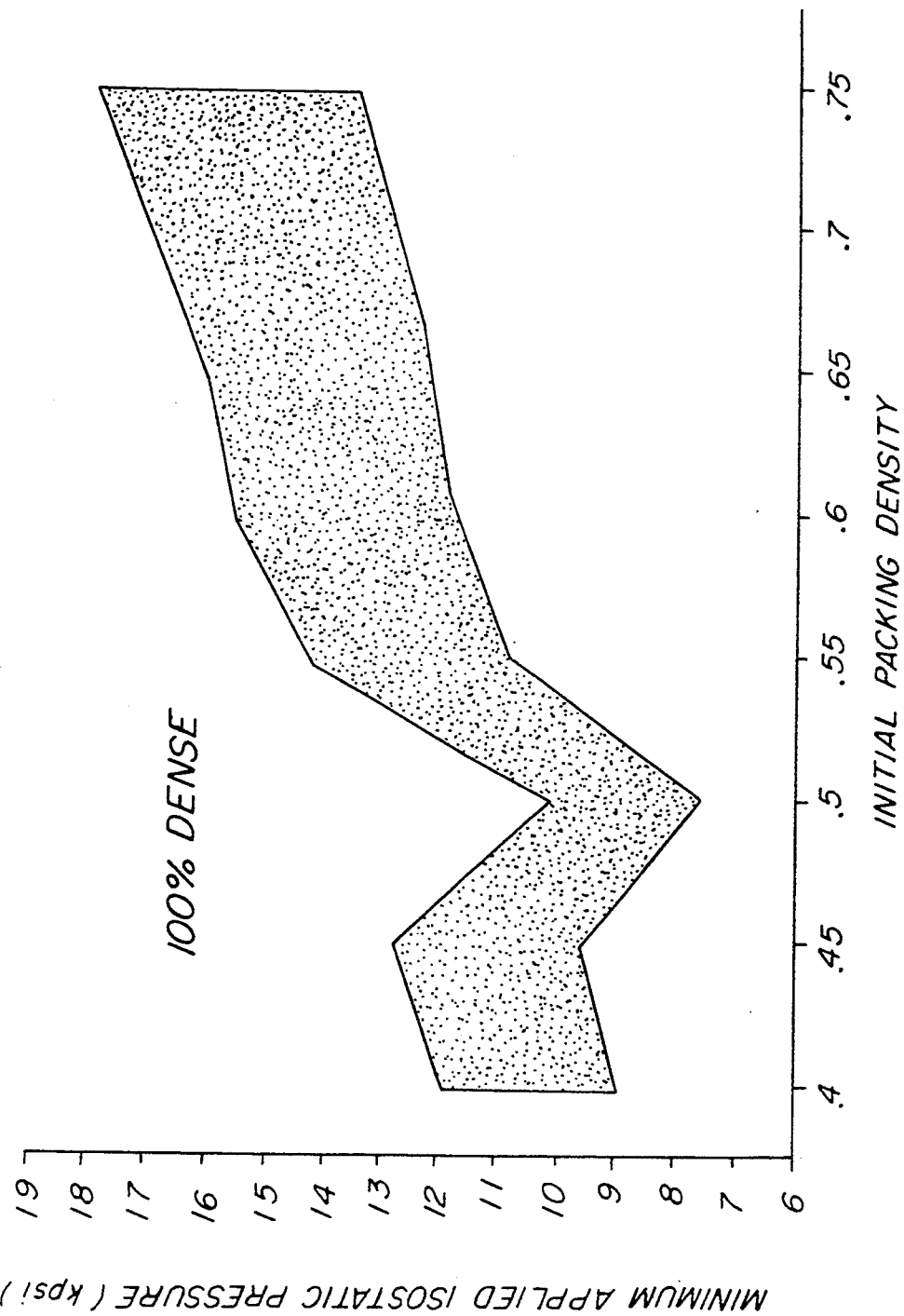

METHOD FOR PRODUCING SPUTTERING TARGET FOR DEPOSITION OF TITANIUM, ALUMINUM AND NITROGEN COATINGS, SPUTTERING TARGET MADE THEREBY, AND METHOD OF SPUTTERING WITH SAID TARGETS

FIELD OF THE INVENTION

The present invention pertains to sputtering targets consisting essentially of Ti, Al, and N, to methods for producing such targets, and to methods of sputtering with such targets.

BACKGROUND OF THE INVENTION

Decorative and wear resistant coatings comprising Ti/Al and N are useful in a variety of applications. For example, such coatings may be used to coat stainless steel panels that are utilized to cover walls, pillars, ceilings, floors, doors, handrails, screens, and other parts of buildings to impart beauty and durability thereto. The coatings may be used to coat markers, pens, and the like, and for watch housing and wristlet coatings, as well as for other cosmetic jewelry applications.

Cathodic sputter processes are used to deposit such coatings by reason of the high production rates and precise coating controls resulting from these methods. Cathodic sputtering techniques are well known and need not be repeated here in detail. Suffice it to say that in accord with such processes, gas ions are caused to bombard a target having a face formed of a desired material that is to be deposited as a thin film or layer on a substrate. Ion bombardment of the target not only causes atoms or molecules of the target material to be sputtered, but imparts considerable thermal energy to the target. This heat is dissipated by use of a cooling fluid typically circulated beneath or around a backing plate that is positioned in heat exchange relation with the target.

The target forms a part of a cathode assembly which together with an anode is placed in an evacuated chamber that contains an inert gas, preferably argon. A high voltage electrical field is applied across the cathode and anode. The inert gas is ionized by collision with the electrons ejected from the cathode. Positively charged gas ions are attracted to the cathode and, upon impingement with the target surface, dislodge the target material. The dislodged target materials traverse the evacuated enclosure and deposit as a thin film on the desired substrate that is normally located proximate the anode.

Conventional methods of sputter depositing Ti/Al/N coatings employ a Ti/Al target prepared by either powder metallurgical or casting techniques. The Ti/Al/N coating is deposited by reactive sputtering of the Ti/Al target in a $N_2$ atmosphere.

Prior art powder metallurgical methods include: (1) mixing the desired stoichiometric ratio of Ti and Al elemental powders, followed by cold isostatic pressing (CIP) of the blended powders to full density; (2) mixing the desired stoichiometric ratio of Ti and Al, prereacting the elemental Ti and Al powders to form intermetallic compounds (TiAl, TiAl$_3$, etc.) followed by hot isostatic pressing (HIP) of the pre-reacted powders to full density and; (3) mixing the desired stoichiometric ratio of Ti and Al elemental powders, followed by simultaneous densification and reaction of the Ti and Al to form the intermetallic by HIPing of the blended and non-reacted elemental powders (reactive HIP).

In addition to the conventional casting and powder metallurgy techniques, U.S. Pat. No. 4,997,538 (Luthier et al) teaches production of a Ti, Al, O, and N target by one of three methods. In the first approach, TiO$_2$ and AlN powders are sintered in a molar ratio of 1.5:2.0. A second alternative is to sinter TiN and Al$_2$O$_3$ powder in a molar ratio of 1.5:1.0. Lastly, another alternative method provides for mixing of TiO$_2$ and AlN powder in a molar ratio of 1.5:2.0 followed by cold pressing. No mention of achieved or optimal density is made in the patent and the method of mixing TiO$_2$ and AlN powder, followed by cold pressing, does not yield a solid target.

The targets produced by Luthier are used in a cathodic arc sputtering system to deposit a black-colored decorative type coating on a substrate in an argon atmosphere. This disclosure is the only one known to the applicants in which a Ti/Al/N coating can purportedly be sputtered without the use of reactive $N_2$ gas.

Another patent which may be of interest is U.S. Pat. No. 4,962,612 (Kuwano) in which Al/Ti alloy targets are prepared by a hot pressing method. The targets so produced are used in a sputter ion plating process in the presence of a mixed Ar/N atmosphere and optional $C_nH_m$ gas component. The atmosphere is maintained under reduced pressure of $10^{-2}$ Torr. to $10^{-4}$ Torr.

The above noted target production methods are not devoid of problems. For example, in certain powder metallurgical methods calling for CIPing of blended elemental powders, when targets produced thereby are subjected to high operating powers, the target temperature can increase to a point where the target constituents undergo an exothermic reaction. This reaction can result in a number of undesirable effects including target swelling, spalling and melting. Consequently, damage to the sputtering apparatus itself may occur with attendant poor coating quality. Accordingly, such deleterious effects preclude the use of high sputtering power and its concomitant high coating deposition rates.

Similarly, targets produced by HIPing of prereacted powders or by reactive HIPing are intermetallic. That is, they consist of true TiAl, Ti$_3$Al or TiAl$_3$ compounds. These intermetallics are brittle in nature and are difficult to machine into the desired shape. Moreover, the targets are subject to cracking problems.

On the other hand, targets produced by conventional casting methods exhibit compositional heterogeneity, segregational effects, grain size control difficulties and brittleness.

Accordingly, it is an object of the invention to provide a method for producing a versatile Ti/Al sputter target, which upon sputtering, can provide decorative and wear resistant coatings. It is especially desirable to provide a method for producing a target that can provide for variable target composition and grain size. The provision of a target which can be operated over a wide range of sputtering powers and temperatures while minimizing cracking and spalling problems attendant upon use of many of the prior art targets is also desirable.

SUMMARY OF THE INVENTION

These and other objects of the invention are met by the provision of a dual phase target consisting essentially of TiN particles in an Al matrix. The targets are produced via powder metallurgy techniques comprising the steps of: mixing TiN and elemental Al powder, compacting the thus formed mixture to the desired density, followed by forming the compacted blend into the shape desired for use as a sputter target. Sputter targets so produced may be used in sputtering coating processes to provide dark, decorative and wear resistant coatings.

The invention will be described in conjunction with the attached drawing and following detailed description.

DESCRIPTION OF THE DRAWINGS

FIG. 1 is a graph illustrating the pressure needed to compact the blend of TiN and Al powders to the full density useful for sputter target formation.

DETAILED DESCRIPTION OF THE PREFERRED EMBODIMENT

In accordance with the invention, fully dense, sputter targets consisting essentially of Ti/Al/ and N are provided for usage in cathode sputter coating processes. The targets are dual phase and consist of TiN particles uniformly dispersed within an Al matrix. As to the density of targets made in accordance with the processes hereof, they comprise a density of at least 90% of the theoretical density of the target constituents. Preferably, the target comprises a density of at least about 95% of the theoretical density and, most preferably, the targets possess at least 99% of the theoretical density.

The targets are preferably produced by blending TiN and Al powders in the desired stoichiometric ratio, followed by cold isostatic pressing (CIPing) of the blended material to densities within the ranges discussed above. Optionally, the CIPing operation may be followed by a light sintering operation to improve the machinability of the consolidated blend. The consolidated blend is machined into the desired target shape which is preferably in the form of a disk having a planar face, but which can also be provided with a concave face. Besides disk-like configurations, the target can be provided in rectangular or other shapes.

The TiN and Al powders have particle sizes of about 100 mesh or less (i.e., from about 5 $\mu$m to about 150 $\mu$m). The powders are provided in volumetric proportion such that the elemental Al powder is present in at least an amount of 40% (by volume) based upon the total volume of elemental Al powder and TiN powder present. More preferably, the Al is present in an amount of at least about 50% or greater (by volume). Based upon presently available experiment data, the Al:TiN volumetric ratio most preferred for use is 2.75 moles Al:1 mole TiN.

As will be appreciated by those skilled in the art, grain size of the final product will be dictated by the particle sizes of the Al and TiN powders chosen. Same can be varied within a wide range, but, as noted above, both of the powders are generally on the order of 100 mesh or less (i.e., the particles range in size from about 5 $\mu$m up to 100 mesh size—$\approx$150 $\mu$m).

After the powders are mixed, they are compacted so as to obtain at least 90% of the theoretical density. Compacting may be achieved by a variety of methods including either cold isostatic pressing (CIPing) or hot isostatic pressing although CIPing is preferred. If HIPing is chosen, care should be taken so that the treatment temperature does not exceed the Al m.p. (i.e., 660° C.).

Compaction by CIPing is clearly preferred. In this procedure, densification occurs solely via yielding and subsequent plastic flow of the Al powder. This method is capable of producing a 100% dense target consisting of TiN particles in an Al matrix. In order to set processing conditions required for full densification, the simple model of Helle et al, FIG. 1, for powder densification is used. Use of the model shown in the figure involves the following simplifying assumptions and material properties:

(1) Only the Al is deforming with the effect of the TiN particles within the Al on the overall yield stress of the powder being ignored. This appears to be a reasonable assumption if the volume occupied by the TiN powder is roughly 50% or less of the total target volume.

(2) The yield stress of the Al is 3 kpsi (20 MPa).

(3) The particles are spherical in shape and are all of the same diameter.

Provided a given initial packing density (as the blended powder is loaded into the CIP mold and vibrated) and a material yield stress of the powder, Helle's model predicts the minimum isostatic pressure necessary to densify the powder to a given density (100% density in this case). Due to the presence of non-uniform particle distribution in the blended powders and the presence of TiN particles, strict adherence to Helle's model will tend to underestimate the compaction pressure needed to result in full densification (i.e., $\geq$99 wt. % of the theoretical value) of the blend. Accordingly, in order to better estimate the minimum pressure necessary to effect full densification, an additional 50–100% of the calculated (Helle's Model) pressure should be used during compaction.

As shown in FIG. 1, lower bound 4 of shaded region 6 indicates the minimum pressure, in Kpsi units, needed to effect full densification taking into account the requirement of an additional 50% of the Helle's calculated minimum. In other words, line 4 indicates 150% of the Helle's minimal calculated value necessary to achieve full densification. Line 8 indicates 200% of the Helle's minimal calculated value necessary to achieve densification. In accordance with the invention, depending on the initial density of the TiN-Al powder blend fed into the CIPing mold, compaction pressure should, during the CIPing process, exceed the values existing on line 4. It is even more desirable to exceed the pressure values given on line 8.

As a practical matter, in many conventionally available CIP presses, compaction pressures of 55 Kpsi and greater are available. Accordingly, pressure needed to effect full densification can be achieved without resort to specialized equipment.

After removal of the blended powders from the compaction press, an optional sintering step may be performed on the compacted blend in order to enhance machinability characteristics. Sintering may, for example, be conducted at temperatures of from about 350°–600° C. for a period of from 30 min. to 3 hours. Preferably, the compacted blend is sintered in air at about 400° C. for about 2 hours.

The resulting sintered shapes can be machined into the shape desired for usage as a cathodic sputter target. Most preferably, a disk-like sputter target is provided. One successfully produced target has a diameter of about 2" and a thickness of about $\frac{1}{8}$".

Sputter targets made by such processes consist essentially of TiN and Al with the TiN particles homogeneously dispersed through the Al matrix. Minor amounts of impurities, such as Fe and some $O_2$, may also be dispersed throughout the material.

A wide variety of sputtering conditions can be employed for successful coating with the targets as provided in accordance with the above. Cathodic sputtering can be performed with or without a reactive gas (N₂) depending on the desired composition of the sputtered coating and its physical and optical properties. It should be noted that the power applied to the target during sputtering should not result in a target temperature rise in which the melting point of Al (i.e., $\approx 660°$ C.) is exceeded. Sputtering in an atmosphere of both an inert and reactive gas is preferred.

A practical and non-limiting example of various sputtering conditions useful in depositing the desired coatings on a glass substrate with targets made in accord with the above is as follows:

Ar and N₂ pressure: 6 μm
Total Ar and N₂ flow: $\approx$186 sccm
Target/Substrate distance: 5 cm
Current: 0.45 amps
Target Voltage: 496 volts Under these conditions, one target produced an opaque dark grey coating on the substrate at a rate of 20.2 Angstroms/second.

The invention will now be further described in conjunction with the following specific examples which are to be regarded as being illustrative and should not be construed to limit the scope of the invention.

EXAMPLES

Example 1

Target Preparation 910 grams of −100 mesh TiN powder were blended with 1090 grams −100 mesh Al powder. (45.5 wt. % TiN/54.5 wt. % Al 14.7 moles TiN; 36.58 moles Al). The blended powders were cold isostatically pressed (CIP) at 55 Kpsi. After CIPing, the consolidated part was 100% dense. The material was then sintered in air at 400° C. for about 2 hours and was machined to a 2" diameter ⅛" thick planar face sputtering target.

Example 2

Sputtering Evaluation

Targets made in accordance with Example 1 were installed in a D.C. sputtering system. Target and substrate were separated by a distance of 5 cm. High purity gaseous nitrogen was admitted into the chamber using a special separated, electronically controlled, feedthrough.

During step-by-step experiments, the partial N2 flow was incrementally increased in 5 sccm steps from 0 to 60 sccm. During the experiments, the total argon and nitrogen backfill pressure was sustained at a fixed range of approx. 6–7.5 μm. This method was chosen to stabilize glow discharge at constant total gases flow.

In all the experiments, the plasma current was sustained as a fixed variable so as to receive comparable data for analysis. The current value was 0.45 A. This current allows a significant sputtering rate over all the experiments.

3000 Å thick films were deposited on 5"×2" glass substrates using the run parameters as follows:

| SPUTTERING CONDITIONS | |
| --- | --- |
| Target | Al TiN |
| T/S distance | 5 cm |
| Ar & N2 pressure | 6–7.5 μm |
| Total Ar & N2 flow | approx. 186 sccm |
| Ar flow decrement | 5 sccm |
| N2 flow increment | 5 sccm |
| Current | .45 A |

Results of the evaluation are shown in Table I.

TABLE I

| Sample ID | Deposit Rate (Å/sec) | N₂ Flow (sccm) | Target Voltage |
| --- | --- | --- | --- |
| A | 26 | 0 | 522 ∧ |
| B | 22.5 | 5 | 490 ∧ |
| C | 20.2 | 10 | 496 ∧ |
| D | 17.2 | 15 | 481 ∧ |
| E | 14.2 | 20 | 465 ∧ |
| F | 10.8 | 30 | 457 ∧ |
| G | 10 | 35 | 438 ∧ |
| H | 9 | 40 | 419 ∧∧ |
| I | 8.6 | 45 | 425 ∧∧∧ |
| J | 8 | 50 | 412 ∧∧∧ |
| K | 8 | 55 | 390 ∧∧∧∧ |
| L | 6.3 | 60 | 388 ∧∧∧∧ | total backfill pressure
∧ - 6 μm
∧∧ - 6.3 μm
∧∧∧ - 6.5 μm
∧∧∧∧ - 7 μm
∧∧∧∧∧ - 7.5 μm The reason to change the total backfill pressure is the discharge stabilization under high N2 flow.

Based upon the above experimental data, preferred sputtering conditions include an N₂ gas flow of 10 sccm with target voltage maintained at about 496 V. One interesting aspect of our findings was that the color of sputtered films changed as the amount of N₂ gas increased. For example, at higher levels (i.e., ≧20 sccm) a gold hue became apparent.

Although the process described above calls for blending of TiN and Al powders, it is possible that acceptable results can be obtained if AlN and Ti powders are used, provided that the volumetric amount of AlN is greater than the Ti. Further, although CIPing is preferred as the compaction method, any powder compaction method can be used which achieves the desired densification providing that the Al melting point is not exceeded. Such alternate methods include simple uniaxial pressing in a die or extrusion of canned powders.

Targets made in accordance with the foregoing provide distinct advantage over prior art Ti/N/Al targets. In this regard, in accordance with the invention, there is no reaction between Ti and Al within the target during sputtering. This makes the target inherently safer to use and allows for the use of higher sputtering power. Additionally, targets in accordance with the invention lack the brittle nature of single phase intermetallic titanium aluminides. This reduces the chances of cracking or spalling of the target which problems can sometimes occur in prior art targets. Further, the targets are fully dense, and target composition and grain size are readily controlled.

While this invention has been described with respect to particular embodiments thereof, it is apparent that numerous other forms and modifications of this invention will be obvious to those skilled in the art. The appended claims and this invention generally should be construed to cover all such obvious forms and modifications which are within the true spirit and scope of the present invention.

What is claimed is:

1. Method of making a dual phase sputter target consisting essentially of TiN particles uniformly dispersed in an Al matrix comprising
   a) mixing TiN and Al powders in an amount necessary to provide a dual phase blend wherein said Al powder is present in an amount of at least 40% by volume based upon the total volume of Al powder and TiN powder present;
   b) densifying said blend to at least about 90% of the theoretical density for said blend; and
   c) forming said densified blend into a desired shape.

2. Method as recited in claim 1 wherein said mixing step (a) comprises providing an amount of Al powder by volume which is at least equal to the amount of TiN powder by volume.

3. Method as recited in claim 2 wherein said Al powder is present in an amount of about 2.75 moles Al powder: about 1 mole TiN powder.

4. Method as recited in claim 1 wherein said step (b) comprises compacting said powders.

5. Method as recited in claim 4 wherein said compacting comprises cold isostatic pressing.

6. Method as recited in claim 4 wherein said compacting is conducted at pressure of at least about 150% of the Helle's minimal calculated value as shown by line 4 in FIG. 1.

7. Method as recited in claim 5 wherein said compacting is conducted at pressure of at least about 200% of the Helle's minimal calculated value as shown by line 4 in FIG. 1.

8. Method as recited in claim 4 wherein said compacting is conducted at pressure of about 55 Kpsi or greater.

9. Method as recited in claim 6 wherein said step (c) comprises forming said densified shape into a disk-like shape.

10. Method as recited in claim 9 wherein subsequent to said step (b) said method comprises sintering said densified blend at a temperature of about 350° to 600° C. for a period of about 30 min. to 3 hours.

11. Method as recited in claim 10 wherein said sintering is conducted at a temperature of about 400° C. for about 2 hours.

12. Method as recited in claim 1 wherein both said TiN and Al powders have particle sizes of less than about 100 mesh.

13. Method as recited in claim 8 wherein said step (b) comprises densifying said blend to at least about 99% of the theoretical density.

14. Method of making a dual phase sputter target consisting essentially of Ti, Al and N, said method comprising
   a) mixing a powdered nitride selected from the group consisting of TiN and AlN powders and mixtures thereof with an elemental powder selected from the group consisting of Ti and Al and mixtures thereof to form a dual phase powder blend consisting essentially of Ti/Al/and N;
   b) densifying said blend to at least about 90% of the theoretical density for said blend; and
   c) forming said densified blend into a desired shape for use as a sputter target.

15. Method as recited in claim 14 wherein said step (a) comprises mixing AlN powder with elemental Ti powder, wherein said AlN powder is present in an amount by volume which is at least equal to the amount of elemental Ti powder by volume.

16. Method as recited in claim 14 wherein said step (b) comprises cold isostatically pressing said blend.

17. Method as recited in claim 16 wherein said pressing is conducted at pressure of 55 Kpsi and greater.

18. Sputter target made by the process recited in claim 1.

19. Sputter target made by the process recited in claim 13.

20. Sputter target made by the process recited in claim 14.

* * * * *